United States Patent [19]

Yu

[11] Patent Number: 4,974,619
[45] Date of Patent: Dec. 4, 1990

[54] WAFER CLEANING DEVICE FOR USE IN MANUFACTURING A SEMICONDUCTOR DEVICE

[75] Inventor: Jung-Sik Yu, Buchun, Rep. of Korea

[73] Assignee: SamSung Electronics Co., Ltd., Suwon, Rep. of Korea

[21] Appl. No.: 306,319

[22] Filed: Feb. 3, 1989

[30] Foreign Application Priority Data

Jun. 29, 1988 [KR] Rep. of Korea .................. 1988-7927

[51] Int. Cl.$^5$ .............................................. B08B 3/04
[52] U.S. Cl. ...................................... 134/76; 134/134; 134/161; 414/226
[58] Field of Search .................. 134/61, 66, 76, 84, 134/134, 161; 414/226

[56] References Cited

U.S. PATENT DOCUMENTS

| | | | |
|---|---|---|---|
| 1,866,124 | 7/1932 | Oertli | 134/66 |
| 2,375,630 | 5/1945 | Davis | 134/66 X |
| 3,082,675 | 3/1963 | Sousa et al. | 134/66 |
| 3,106,925 | 10/1963 | Rand | 134/66 X |
| 3,152,685 | 10/1964 | Heck | 134/66 X |
| 3,276,983 | 10/1966 | Dolan et al. | 134/66 X |

*Primary Examiner*—Frankie L. Stinson
*Attorney, Agent, or Firm*—Robert E. Bushnell

[57] ABSTRACT

There is disclosed a cleaning device for cleaning a semiconductor wafer. According to the present invention, ech of the steps of the cleaning process used a separate carrier, so that none but the wafers need be washed, saving washing time. When drying, the surfaces of the wafers are kept from being contaminated by residual cleansers, thereby improving the yield rate.

16 Claims, 1 Drawing Sheet

4,974,619

WAFER CLEANING DEVICE FOR USE IN MANUFACTURING A SEMICONDUCTOR DEVICE

BACKGROUND OF THE INVENTION

The present invention relates to a cleaning device for cleaning a wafer on the manufacture of semiconductor device. Specifically, the invention is directed to the device wherein there is exclusively used a separate carrier in each of the several stages of the cleaning process, so that the contamination of the cleaning product can be prevented.

Conventionally, a wafer fabrication stage for the manufacture of semiconductor device requires a cleaning process in which the wafer is extremely cleaned out by a chemical cleaning product prior to processing each unit prior to fabricating a semiconductor device using the wafers. The cleaning process generally includes the steps of removing the impurities from the surface of the wafer by using the cleanser of $NH_4OH$ cleaning said wafer in a pure water bath so as to remove the remnants of the cleanser on the surface of the wafer, washing again the wafer by using the cleanser of HCI, cleaning the wafer in the pure water so as to remove the cleanser, washing the wafer in the pure water bath so as to completely remove the cleansers and impurities, and finally drying the wafer. This process usually takes about 5 to 10 minutes in total.

In such a known process, the carrier that holds therein a plurality of wafers is processed without changing said carrier in a single cleaning process, until the cleaning process will be completed prior to other fabrication stage. On the other hand, because the Teflon carrier itself used presently tends to absorb a part of the cleanser, it may be not completely cleaned out by washing it in the pure water. Moreover, if the cleanser remaining in slots or the like for loading the wafer are not completely removed by wahing in the water, and proceeds further to a next fabrication stage, for example a drying stage, a part of the cleaning product could be spreaded out by the centrifugal force arising from the rotation of the drier, thereby speckling the surfaces of the wafers. Hence, the surfaces of the wafers could be fatally contaminated, finally reducing the yield rate in the fabrication of the semiconductor devices.

SUMMARY OF THE INVENTION

It is an object of the present invention to solve the above problem.

It is another object of the present invention to provide a wafer cleansing device for use in the manufacture of semiconductor devices, wherein each separate carrier for wafers is used for each of a plurality of cleaning processes in the fabrication stages of the semiconductor devices.

It is still another object of the present invention to provide a wafer cleaning device being capable of preventing the cleaning products used from mixing with each other, thereby increasing the cleaning effect of the wafers.

According to the present invention, each of the steps of the cleaning process uses a separate carrier rather than a single integrated carrier of wafers throughout the process, so that only the wafers to be processed may be washed, thus eliminating the necessity of cleaning the carrier, thereby saving the entire cleaning time in the process. Furthermore, during a drying process, the surfaces of the wafers are kept from being contaminated by the remaining cleaning products, consequently increasing the yield rate in the manufacture of the entire semiconductor devices.

BRIEF DESCRIPTION OF THE ATTACHED DRAWING

FIG. 1 is a schematic diagram of the inventive cleaning device.

DETAILED DESCRIPTION OF THE INVENTION

Figure 1:
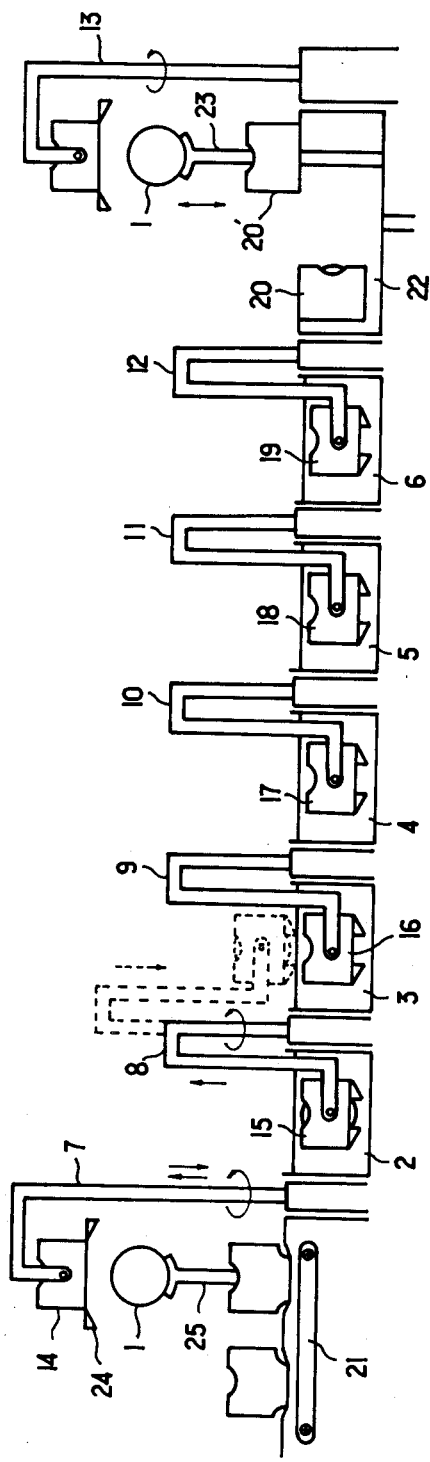

The present invention will now be described in more detail with reference to the drawing attached only by way of example.

A plurality of cleaning baths 2,3,4,5,6 for cleaning a wafer 1 therein are disposed in series with a fixed interval of each other. A conveyor 21 disposed in the vicinity of a first cleaning bath 2 conveys the wafer 1 into the first cleaning bath 2 by using a carrier 14 of a hoisting and rotating arm 7. A plurality of hoisting and rotating arms 7-13 including each carrier in the ending part thereof are each arranged serially between any two of the conveying means, the cleaning baths 2-6 and a wafer drying means 22. The drying means 22 dries the wafer 1 received from the fifth cleaning bath 6, and has a hoist 23 for pushing the dried wafer 1. A plurality of separate carriers 14-20 are respectively attached to each of the hoisting and rotating arms for carrying the wafer 1 successively from the conveyor 21 to the drier through the series of said cleaning baths. A reference numeral 24 in the drawing is a cradle in the carrier operated to grasp the wafer.

The wafer 1 conveyed on the conveyer 21 to be processed during the cleaning stage is pushed up by hoist 25. Then, the hoisting and rotating arm 7 is slightly lowered from the uppermost position to load the wafer 1 in the carrier 14, which is closed by contracting the cradle 24. Thereafter, the hoist 25 is lowered to return to the original position, and arm 7 is rotated by a 180° direction from the initial one, so that the first carrier 14 can be positioned over the second carrier 15, where the cradle 24 is opened to move the wafer from the first carrier 14 to the second carrier 15. Thus, the wafer received in the second carrier 15 has been cleaned in the first cleaning bath 2 having a cleanser.

After cleaning the wafer in the cleaning bath 2 of cleanser, the second arm 8 is raised and rotated by 180°, so that the second carrier 15 can be positioned over the third carrier 16 attached to the third arm in the second cleaning bath 3. Then, the wafer 1 is moved from the second carrier into the third carrier 16, where the cleanser possible remaining on said wafer can be removed in pure water. After washing the wafer 1 with the water in the second cleaning bath 3, the wafer 1 is again cleaned by a cleanser in the third cleaning bath. The wafer cleaned by the cleanser is then washed with water in the fourth cleaning bath. Finally, the wafer will be completely cleaned with the water in the fifth cleaning bath 6 and is then moved into the drying means 22. The procedure of moving the wafer 1 is the same as the aforementioned and, therefore, will be not explained again here.

The wafer moved into the drying means 22 is completely rid of the remaining water by the centrifugal force thereon arising from the rotation of the dryer 22. Then, the dried wafer is raised upward by the hoisting means 23, and is moved into the carrier attached to the seventh arm 13 so as to be subjected to any subsequent process.

As described above, the cleaning device of the present invention uses a separate carrier in each cleaning bath, so that the various cleansers used in the different cleaning baths can not be mixed with each other. Moreover, since only the wafer is washed with pure water, the time for washing with pure water is reduced as well as the consumption of pure water. Also, the carrier used in drying is not used in the cleaning baths of cleansers, so that the wafer is not contaminated by the remaining cleanser when drying, thereby increasing the yield rate of semiconductor manufacturing.

The foregoing description shows only a preferred embodiment of the present invention. Various modifications are apparent to those skilled in the art without departing from the scope of the present invention which is only limited by the appended claims. Therefore, the embodiment shown and described is only intended to be illustrative, not restrictive.

What is claimed is:

1. A cleaning device for cleaning a semiconductor wafer, comprising:
   a series of cleaning baths arranged in a fixed interval with each other for cleaning a semiconductor wafer,
   a wafer conveyor for conveying the wafer to the first one of said cleaning baths,
   wafer drying means for drying the wafer received from the last one of said cleaning baths,
   said wafer drying means having hoisting means for hoisting the dried wafer, and
   a plurality of hoisting the rotating arms each having a separate corresponding one of a plurality of carrier means for carrying the wafer successively from said conveyor to said drying means through said series of cleaning baths, each of said hoisting the rotating arms being arranged between any two of said conveyor, cleaning baths and drying means with each of said arm holding its corresponding carrier while the wafer passes through said corresponding carrier means and into a successive one of said carrier means engaged by a successive one of said arms as the wafer is transferred between corresponding successive and said baths, whereby a separate carrier is used in each of said cleaning baths and said drying means.

2. The device of claim 1, further comprised of a plurality of said carriers having upper portions and lower portions permitting passage of the wafer through corresponding ones of said plurality of carriers, and means for retaining the wafer within said plurality of carriers.

3. The device of clain 2, wherein said retaining means is comprised of contractable cradles disposed adjacent to said lower portions of corresponding ones of said plurality of carriers.

4. The device of claim 1, further comprised of a plurality of each of said carriers having an upper portion for receiving a wafer, a lower portion for discharging the wafer, and a contractable cradle for retaining the wafer within said plurality of carriers.

5. A semiconductor wafer cleaning device, comprising:
   a series of cleaning baths arranged in a fixed interval with each other for cleaning a semiconductor wafer,
   a wafer conveyor for conveying the semiconductor wafer to the first one of said cleaning baths, and
   a plurality of hoisting arms each having a different and separate corresponding one of a plurality of carriers for engaging the semiconductor water, each of said hoisting arms holding a corresponding carrier as the wafer passes through its corresponding carrier and into a successive one of said carriers engaged by a successive one of said hoisting arms corresponding to said successive one of said carriers as the wafer is transferred sequentially through said series of cleaning baths, each of said hoisting arms being arranged between any two of said conveyor and said cleaning baths, whereby a separate carrier is used in each of said cleaning baths.

6. The device of claim 5, further comprised of each carrier of a plurality of said hoisting arms having upper portions and lower portions permitting passage of the wafer through said plurality of carriers, and means for retaining the wafer within said plurality of carriers.

7. The device of claim 6, wherein said retaining means is comprised of contractable cradles disposed adjacent to said lower portions of corresponding ones of said plurality of carriers.

8. The device of claim 5, further comprised of a plurality of each of said carriers having an upper portion for receiving a wafer, a lower portion for discharging the wafer, and a contractable cradle for retaining the wafer within said plurality of carriers.

9. A semiconductor wafer cleaning device, comprising:
   a series of cleaning baths arranged in a fixed interval with each other for cleaning a semiconductor wafer,
   means for conveying the semiconductor wafer toward a first one of said cleaning baths, and
   a plurality of discrete carriage means each having lower portions permitting passage of the semiconductor wafer through said carriage means, for transferring the wafer successively from said conveying means and sequentially through said series of cleaning baths, each of said carriage means being arranged between any two of said conveying means and said cleaning baths, whereby a different one of said carriage means is used in correspondence with each of said cleaning baths.

10. The device of claim 9, further comprised of a plurality of said carriage means having upper portions and said lower portions permitting passage of the wafer through said plurality of carriage means, and means for retaining the wafer within said plurality of carriage means.

11. The device of claim 10, wherein said retaining means is comprised of contractable cradles disposed adjacent to said lower portions of corresponding ones of said plurality of carriage means.

12. The device of claim 9, further comprised of a plurality of each of said carriage means having an upper portion for receiving a wafer, said lower portion for discharging the wafer, and moveable means for retaining the wafer between said upper and lower portions of corresponding ones of said plurality of carriage means.

13. A workpiece bath comprising:
   a series of cleaning baths arranged sequentially relative to each other for receiving workpieces,
   means for conveying the workpieces toward a first one of said baths, and a plurality of discrete carriage means each having upper portions and porous lower portions accommodating passage of the workpieces through said plurality of carriage means, and moveable means for retaining the workpieces within said plurality of carriage means between said upper and lower portions, said carriage means for transferring the workpieces successively from said conveying means and sequentially through said series of baths, with each of said carriage means being arranged between any two of said conveying means and said cleaning baths, whereby a different one of said carriage means is used in correspondence with each of said baths.

14. Apparatus for cleaning semiconductor wafers, comprising:

a series of cleaning baths arranged in succession relative to each other for successively receiving semiconductor wafers, means for conveying semiconductor wafers to the first one of said cleaning baths, means for successively lifting each of the semiconductor wafers from corresponding ones of said baths in different corresponding porous carriages arranged betweeen each successive pair of said baths, positioning each of the semiconductor wafers above a successive one of said baths in said different corresponding carriages, and lowering each of the semiconductor wafers from a lower portion of said different ones of said corresponding carriages and through an upper portion of successive ones of said corresponding carriages for successive ones of said baths, and means for removing the semiconductor wafers from the last one of said cleaning baths and drying the semiconductor wafers received from the last one of said cleaning baths, whereby a separate one of said carriages is used in each of said cleaning baths for said step of drying the semiconductor wafers.

15. the aparatus of claim 14, further comprised of said lifting means maintaining a substantially constant vertical relation between lower and upper portion of each of the semiconductor wafers while the semiconductor wafers are subjected to said lifting, positioning and lowering.

16. The apparatus of claim 14, further comprised of said lifting means maintaining a substantially constant vertical relation between lower and upper portions of each of the semiconductor wafers while the semiconductor wafers are subjected to said steps of lifting, positioning and lowering between a plurality of said baths.

* * * * *